United States Patent [19]

Berkowitz

[11] Patent Number: 5,462,809
[45] Date of Patent: Oct. 31, 1995

[54] GIANT MAGNETORESISTANT SINGLE FILM ALLOYS

[75] Inventor: Ami Berkowitz, Del Mar, Calif.

[73] Assignee: The Regents of the University of California, Alameda, Calif.

[21] Appl. No.: 179,346

[22] Filed: Jan. 10, 1994

Related U.S. Application Data

[62] Division of Ser. No. 899,431, Jun. 16, 1992, abandoned.

[51] Int. Cl.$^6$ ..................................................... G11B 5/00
[52] U.S. Cl. ........................... 428/546; 428/558; 428/561; 428/611; 428/614; 428/692; 428/694 T
[58] Field of Search ................................ 428/546, 558, 428/561, 611, 614, 692, 694 T

[56] References Cited

U.S. PATENT DOCUMENTS

| | | | |
|---|---|---|---|
| 3,549,428 | 12/1970 | Lommel | 148/31.55 |
| 4,520,040 | 5/1985 | Cordts | 427/38 |
| 4,643,942 | 2/1987 | Ohtsubo | 428/328 |
| 4,663,242 | 5/1987 | Pryor | 428/558 |
| 4,751,100 | 6/1988 | Ogawa | 427/38 |
| 4,994,320 | 2/1991 | Jagielinski | 428/336 |
| 5,158,933 | 10/1992 | Holtz | 305/1 |

*Primary Examiner*—Stevan A. Resan
*Attorney, Agent, or Firm*—Brown, Martin, Haller & McClain

[57] ABSTRACT

A single layer film is deposited onto a substrate at room temperature from two sources, one source being a magnetic material, the other being a non-magnetic or weakly-magnetic material. The film is annealed for predetermined time in order to induce phase separation between the magnetic clusters and the non-magnetic matrix, and to form stable clusters of a size such that each magnetic particle, or cluster, comprises a single domain and has no dimensions greater than the mean free path within the particle.

12 Claims, 1 Drawing Sheet

GIANT MAGNETORESISTANT SINGLE FILM ALLOYS

This invention was made with Government support under Grant No. NSF-90-10908, awarded by the National Institute Science Foundation. The Government has certain rights in this invention. This is a division of application Ser. No. 07/899,431, filed Jun. 16, 1992, now abandoned.

BACKGROUND OF THE INVENTION

The drive towards higher density data storage on magnetic media has imposed a significant demand on the size and sensitivity of magnetic heads. This demand has been met, in part, by thin film inductive and magnetoresistive heads which can be fabricated in very small sizes by deposition and lithographic techniques similar to those used in the semiconductor industry. Thin film inductive heads are subject to the same problems as their core-and-winding predecessors of extreme sensitivity to gap irregularities and stray fields which result in output signal losses. Thin film magnetoresistive heads, on the other hand, rely on changes in the material's resistance in response to flux from the recording media and do not require precise gap modeling. For these reasons, inter alia, magnetoresistive elements are increasingly preferred over inductive heads for reading data stored at high densities on magnetic media.

A figure of merit for magnetoresistive (MR) elements is $\Delta R/R$, which is the percent change in resistance of the element as the magnetization changes from parallel to perpendicular to the direction of the current. Current magnetoresistance elements are made from permalloy (81% Ni/19% Fe), which, at room temperature has a $\Delta R/R$ of about 3%. For improved response, a higher value of $\Delta R/R$ is desirable.

Recently, it has been found that magnetic layered structures with anti-ferromagnetic couplings exhibit giant magnetoresistance (GMR) in which, in the presence of a magnetic field, $\Delta R/R$ can be as high as 50%. The GMR phenomenon is derived from the reorientation of the single domain magnetic layers. For optimum properties, the thickness of the multilayers must be less than 3 nm, and $\Delta R/R$ increases with the number of pairs of thin film layers. Thus, these multilayers provide significant challenges for production because of the precision with which the thicknesses and other features, such as interface roughness, must be maintained for the many iterations of the pairs of magnetic and non-magnetic films. Several studies have shown that GMR oscillates in magnitude as a function of the thickness of the non-magnetic layers, increasing the concern about thickness control. These layered structures are also subject to output noise from magnetic domains, and, since their outputs are nonlinear, the devices must be biased to obtain a linear output. Most reported work has been on Fe/Cr superlattices, however, Co/Cr, Co/Cu and Co/Ru superlattices have also been found to exhibit GMR.

The extreme sensitivity to layer thickness places significant limitations on practical and economical application of GMR to data. recording and other potential uses. It would be desirable to provide a method for forming GMR materials which is relatively insensitive to thickness and does not require multiple layers, and where the material is not subject to output noise caused by domains or to the nonlinearities of the layered structures. It is to such a method and material that the present invention is directed.

SUMMARY OF THE INVENTION

It is an object of the present invention to provide heterogeneous alloys which exhibit giant magnetoresistance.

It is a further object of the present invention to provide a method for forming such alloys.

In the preferred embodiment, a single layer film is sputtered onto a substrate at room temperature from separate targets, one target being a ferromagnetic material, the other being a non-ferromagnetic or weakly-magnetic material. The film is annealed for a predetermined time in order to induce phase separation between the magnetic clusters and the non-magnetic matrix, and to form stable clusters of a size such that each magnetic particle, or cluster, comprises a single domain and has no dimension greater than the mean free path within the particle.

Other deposition and film-forming techniques may be used including sputtering from a single composite target, evaporation, metal pastes, mechanically combining the magnetic and non-magnetic materials or implanting the magnetic materials (ions) into the non-magnetic matrix.

While a distinct interface needs to be maintained between the magnetic and non-magnetic components of the film, the film can be formed from materials which are either immiscible or miscible under equilibrium conditions. In the latter case, deposition conditions can be controlled to assure that the desired interfaces are formed between the magnetic and non-magnetic components of the film.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which.

DETAILED DESCRIPTION OF THE PREFERRED EMBODIMENT

A single layer film comprising a magnetic material and a non-magnetic, or weakly-magnetic, material (hereinafter collectively identified as "non-magnetic") is deposited on a substrate by d.c. magnetron co-sputtering from separate targets. The sputter deposition is performed at low pressures, in the $10^{-7}$ torr range. The film is formed with the non-magnetic film providing a matrix within which magnetic particles or clusters are precipitated. After deposition, the sample may be annealed to control the size of the particles. The ideal particles must be large enough to avoid superparamagnetism (thermally-activated magnetization reversal at room temperature), but small enough that their dimensions do not exceed the mean free path within the particles, and so that they remain a single magnetic domain. In an actual sample there will be some variation in particle size within a given film, with some particles smaller than, and others larger than, the "ideal". The average particle size in such a sample should possess the desired relationships to domain and mean free path.

A number of other deposition or film-forming techniques may also be used, including evaporation, pastes or mechanically-formed metals, e.g., heated and compressed by high pressure rollers. Magnetic materials may also be implanted into a non-magnetic matrix. Any of these or similar techniques can then be followed by heat processing to assure formation of the desired magnetic precipitates.

By precipitating small magnetic particles in a non-magnetic matrix, an increased surface area of magnetic material is made available for the electron scattering that is responsible for magnetoresistance (MR). This dependence upon available surface area indicates that the magnetic and non-magnetic materials must remain separate with distinguishable interfaces. This requirement follows the explanations of MR in multilayered structures that the electrons are scattered at the interfaces, where spin dependent scattering predominates. The need for distinct interfaces between the magnetic and non-magnetic materials does not, however, limit the choice of materials to those that are mutually insoluble. While the materials can be immiscible under equilibrium conditions, they can also be miscible, with the materials being kept separate by controlling deposition conditions.

In initial evaluations, "cobalt-copper (Co—Cu) films were prepared by d.c. magnetron sputtering from separate copper and cobalt targets onto a silicon wafer having 100 orientation. A 3.5 minute pre-sputter step was performed prior to deposition. Background pressure was $6 \times 10^{-7}$ torr. The deposition step of approximately 100 minutes at room temperature with the substrates rotated above the targets at one revolution per second provided a 3,000 Å film.

Figure 1:
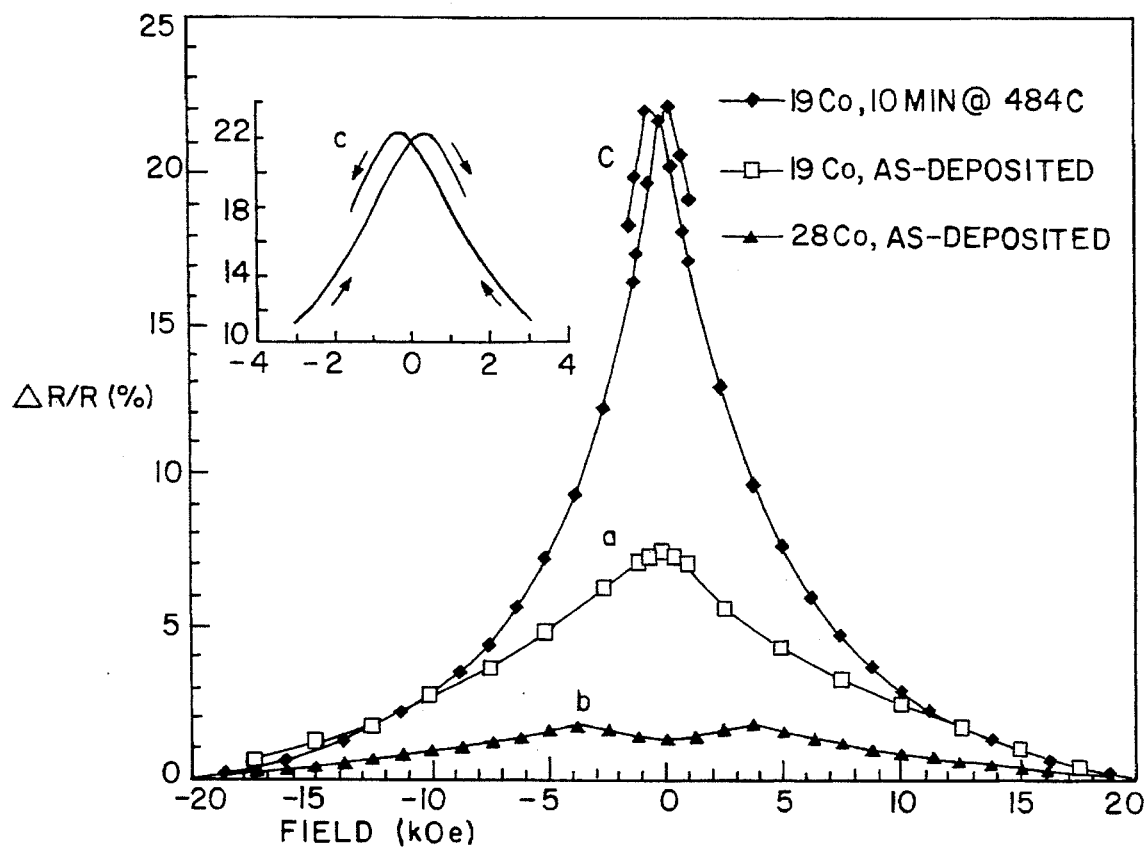
FIG. 1 is a plot of resistance ratio with applied magnetic fields for the inventive film.

Sputter rates were adjusted to yield films of 12, 19 and 28 atom percent cobalt. These samples exhibited GMR at 10° K. with MR negligible at room temperature, indicating a superparamagnetic behavior due to a highly disordered state and fine grain size. The samples were annealed to increase grain size, to achieve phase separation between cobalt and copper, and to form stable cobalt particles. After annealing, the 19 Co and the 28 Co samples show the largest MR changes. Their MR curves had the shape shown in line C of FIG. 1. The maximum MR occurred at the coercive force, $H_c$, which was approximately 500 Oe at 10° K. for all annealed 19 Co and 28 Co samples. Remanence/saturation ($M_r/M_s$) ratios were greater than 0.3 at 10° K. for all annealed samples. Both $H_c$ and $M_r/M_s$ decreased with increased temperature at measurement and annealing time. The magnetic behavior of the annealed samples was associated with the precipitation of cobalt-rich particles in a copper-rich matrix.

Figure 2:
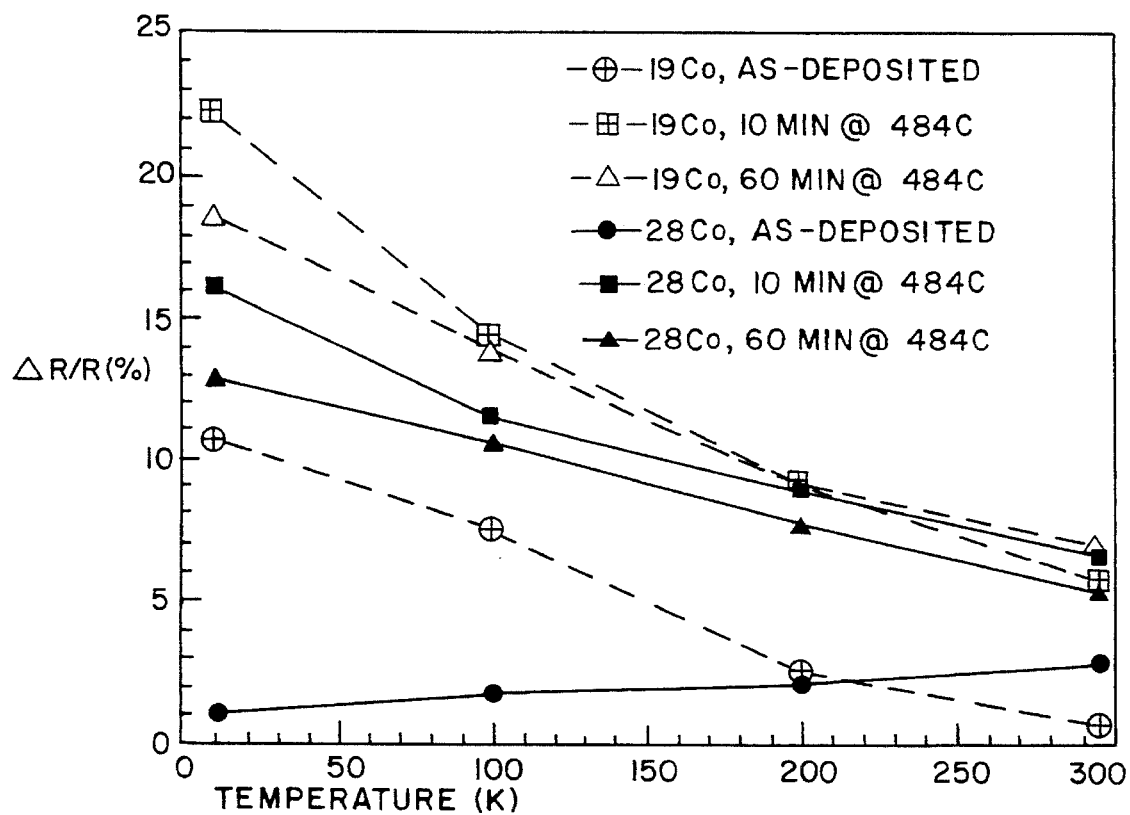
FIG. 2 is a plot of resistance ratio with temperature.

FIG. 2 shows $\Delta R/R$ versus temperature for as-deposited and annealed 19 Co and 28 Co specimens. Saturation fields for the MR coincided with the saturation fields for magnetization. The MR ratio increased with decreasing annealing temperature and time (except for the as-deposited 28 Co).

As annealing times and temperatures increase, the average Co-rich particle sizes also increase, with corresponding decrease in MR. Larger Co particles have several adverse effects on MR: 1) the surface/volume ratio decreases, reducing the spin-dependent interfacial scattering relative to bulk-scattering processes; 2) the particles become larger than the mean-free path within the particles; and 3) the particles are no longer single domains such that the interaction of the conduction electron spins with the varying magnetization distribution in the particles produces a state in which the conduction electron spin channels are mixed. Also seen in FIG. 2 is the rapid relaxation rate of MR with increasing temperature, which is attributable to superparamagnetism.

The GMR in the heterogeneous copper-cobalt alloys may be analyzed in the same manner as the copper-cobalt multilayers. Assuming a random distribution of cobalt particles with average radius $r_{Co}$ in a copper matrix, and adopting a spin-dependent scattering model at the surface of cobalt particles and within the cobalt particles, the conductivity can be written as:

$$\sigma = \frac{ne^2}{2m} \sum_\sigma \frac{1}{\Delta^\sigma} \quad (1)$$

where n is the number of electrons; e is the electron charge, m is the electron mass, and $\Delta^\sigma$ is the average scattering matrix. The phenomenological input for $\Delta^\sigma$ is:

$$\Delta^\sigma = \Delta_{Cu} + \Delta_{Co}{}^\sigma + \Delta_s{}^\sigma \quad (2)$$

where $$\Delta_{Cu} \propto \frac{1-c}{\lambda_{Cu}},$$

$$\Delta_{Co}^\sigma \propto \frac{c}{\lambda_{Co}} (1 + p_{Co}^2 + 2p_{Co}\hat{\sigma}\hat{M}_{Co}),$$

$$\Delta^{\sigma_s} \propto \frac{3c\xi}{r_{Co}} (1 + p^{2s} + 2p_s\hat{\sigma}\hat{M}_{Co}),$$

and c is the Co concentration; $\lambda_{Cu}$ and $\lambda_{Co}$ are the mean free paths of Cu and Co, respectively; $\xi$ is the scattering strength for surfaces; $P_{Co}$ and $P_S$ are the spin dependent ratios for scattering within the Co particles and at their surfaces, respectively. Thus Equation (1) is the sum of scattering in Cu, Co, and at the interfaces between them. Since $$MR = \frac{\sigma(H=H_S) - \sigma(H=H_C)}{\sigma(H=H_C)} \quad (3)$$

Equation (2) is substituted into Equation (1), and Equation (3) becomes:

$$MR = \frac{\sigma^\uparrow(H=H_S) + \sigma^\downarrow(H=H_S) - 2\sigma(H=H_C)}{2\sigma(H=H_C)} \quad (4)$$

where $$\sigma^{\uparrow\downarrow}(H=H_S) = \left[ \frac{1-c}{\lambda_{Cu}} + \frac{c}{\lambda_{Co}}(1+p_{Co}^2) + \frac{3c\xi}{r_{Co}}(1 \pm p_s)^2 \right]^{-1}$$

with ± referring to spin up and down, and $$\sigma(H=H_C) = \left[ \frac{1-c}{\lambda_{Cu}} + \frac{c}{\lambda_{Co}}(1+p_{Co}^2) + \frac{3c\xi}{r_{Co}}(1+p_s^2) \right]^{-1}.$$

In Co/Cu multilayers, the principal spin dependent scattering is from the interfacial term ($P_S$=0.5 $P_{Co}$=0.2, $\xi$=0.3) [16]. Thus, if $P_{Co}$=0, Equation (4) reduces to $$MR \approx \frac{4p_s^2}{(1-p_s^2)^2 + 2\sigma(1+p_s^2)r_{Co} + \sigma^2 r_{Co}^2}, \quad (5)$$

where $$\sigma = \left( \frac{1-c}{\lambda_{Cu}} + \frac{c}{\lambda_{Co}} \right) /3c\xi \quad (6)$$

Equation (5) correctly predicts the inverse dependence of MR on the particle size, in accordance with the surface/ volume ratio consideration noted above.

A consideration in the development of magnetoresistive films for practical applications is that the applied saturation field be as low as possible while still achieving the maximum ΔR/R. It is well known that soft ferromagnetic materials provide greater MR with lower applied fields. Materials which may be used as softer magnetic particles include those which are well known in the recording industry for their use in inductive heads, including iron, cobalt-iron, and permalloy.

Another factor which will influence the efficiency of the saturation field in inducing magnetoresistance is the shape of the magnetic particles. A demagnetizing field will be generated by a spherical particle such that an additional field must be overcome by the applied saturation field. By controlling the shape of the particles during deposition, disc-like particles can be formed which possess lower demagnetization fields while still having large surface areas. Preferably, the plane of the disc-like particles will be oriented parallel to the field. Such an effect can be achieved by control of deposition parameters or by post-deposition anneal under a magnetic field.

For practical applications, a robust material such as silver may be desirable for use as the non-magnetic matrix. Cobalt and silver are immiscible under equilibrium conditions. After annealing one hour at 200° C., the ΔR/R at room temperature for a sample of 33 atom-% Co in silver was measured at 21.5%. An advantage of using silver is its relatively high environmental stability, i.e., minimal corrosion or oxidation, and such an alloy system is much easier to prepare and control than multilayers. Silver is further suited for use in such an application because none of the magnetic elements are soluble in silver. Other possible matrix materials include ruthenium, gold and chromium, among others. It is also desirable to supplement or substitute the cobalt, which is a hard magnetic material, with softer magnetic materials.

The above-described method eliminates the need for use of multilayers for achieving giant magnetoresistance. The single layer film of the present invention possesses several advantages over the prior GMR materials in that it is easier to control fabrication, its output may be linear, and there are no domains so that there are no domain walls to produce noise. It is anticipated that the inventive film will significantly enhance the fabrication of MR heads, making such films more practical and economical than those of the current technology.

It will be evident that there are additional embodiments which are not illustrated above but which are clearly within the scope and spirit of the present invention. The above description and drawings are therefore intended to be exemplary only and the scope of the invention is to be limited solely by the appended claims.

I claim:

1. A single layer film which exhibits giant magnetoresistance comprising:

a substantially non-magnetic metallic matrix on a substrate; and a plurality of magnetic particles suspended within said substantially non-magnetic metallic matrix wherein each magnetic particle comprises a single magnetic domain having a size less than a mean free path within said magnetic particle and such that an amount of spin-dependent interfacial scattering from an outer surface of said magnetic particles is increased relative to an amount of bulk scattering within said magnetic particles to increase giant magnetoresistance in accordance with the relationship, $$MR \approx \frac{4p_s^2}{(1-p_s^2)^2 + 2\sigma(1+p_s^2)r_{MR} + \sigma^2 r_{MR}^2},$$

where $$\sigma = \left( \frac{1-c}{\lambda_{MX}} + \frac{c}{\lambda_{MR}} \right) /3c\xi$$

and $r_{MR}$ is an average radius of said magnetic particles, $P_S$ is a spin-dependent ratio for scattering at a surface of said magnetic particles, $\lambda_{MX}$ is a mean free path in said substantially non-magnetic matrix, $\lambda_{MR}$ is a mean free path in said magnetic particles, $\xi$ is a scattering strength for said surface of said magnetic particles, and c is a concentration of said magnetic particles.

2. A single layer film as in claim 1 wherein each magnetic particle has a plurality of dimensions, the largest of which is less than a mean free path within said magnetic cluster.

3. A single layer film as in claim 2 wherein each magnetic particles has a shape which has a first dimension which is much less along one axis than along other axes.

4. A single layer film as in claim 3 wherein said magnetic particles are aligned with their largest dimensions parallel to a plane of said single layer film.

5. A single layer film as in claim 1 wherein said magnetic particles are cobalt.

6. A single layer film as in claim 1 wherein said magnetic particles are a soft ferromagnetic material.

7. A single layer film as in claim 1 wherein said substantially non-magnetic matrix is copper.

8. A single layer film as in claim 1 wherein said substantially non-magnetic matrix is silver.

9. A heterogeneous film having giant magnetoresistive response to an applied magnetic field comprising:

a plurality of magnetic particles; and a matrix comprising a metallic material having a magnetism much less than a magnetism of said magnetic particles, said plurality of magnetic particles being suspended within said matrix, said matrix being insoluble with said magnetic particles;

wherein each of said plurality of magnetic particles has a size which is less than a mean free path within each said magnetic particle and said size is such that an amount of spin-dependent interfacial scattering from an outer surface of said magnetic particles is increased relative to an amount of bulk scattering within said magnetic particles to increase giant magnetoresistance in accordance with the relationship $$MR \approx \frac{4p_s^2}{(1-p_s^2)^2 + 2\sigma(1+p_s^2)r_{MR} + \sigma^2 r_{MR}^2},$$

where $$\sigma = \left( \frac{1-c}{\lambda_{MX}} + \frac{c}{\lambda_{MR}} \right) /3c\xi$$

and $r_{MR}$ is an average radius of said magnetic particles, $p_s$ is a spin-dependent ratio for scattering at a surface of said magnetic particles, $\lambda_{MX}$ is a mean free path in said matrix, $\lambda_{MR}$ is a mean free path in said magnetic particles, $\xi$ is a scattering strength for said surface of said magnetic particles, and c is a concentration of said magnetic particles.

10. A heterogeneous film as in claim 9 wherein each magnetic particle comprises a single magnetic domain.

11. A heterogeneous film as in claim 9 wherein each magnetic particle has a shape which has a first dimension which is much less along one axis than along other axes.

12. A heterogeneous film as in claim 11 wherein said magnetic particles are aligned with their largest dimensions parallel to a plane of said heterogeneous film.

* * * * *